(12) United States Patent
Choi

(10) Patent No.: US 8,465,908 B2
(45) Date of Patent: Jun. 18, 2013

(54) METHOD FOR FORMING FINE PATTERNS OF SEMICONDUCTOR DEVICE

(75) Inventor: Jae Seung Choi, Icheon-shi (KR)

(73) Assignee: Hynix Semiconductor Inc., Icheon-si (KR)

( * ) Notice: Subject to any disclaimer, the term of this patent is extended or adjusted under 35 U.S.C. 154(b) by 1103 days.

(21) Appl. No.: 12/272,192

(22) Filed: Nov. 17, 2008

(65) Prior Publication Data

US 2009/0317748 A1 Dec. 24, 2009

(51) Int. Cl.
*G03F 7/20* (2006.01)
(52) U.S. Cl.
USPC .............................. 430/312; 430/313; 430/314

(58) Field of Classification Search
USPC ......................................... 430/312, 313, 314
See application file for complete search history.

(56) References Cited

U.S. PATENT DOCUMENTS

| 7,510,973 | B2 | 3/2009 | Kong ............................. 438/691 |
| 7,531,449 | B2 | 5/2009 | Park et al. ..................... 438/638 |
| 7,536,671 | B2 | 5/2009 | Shin et al. ........................ 716/21 |
| 2008/0160771 | A1 | 7/2008 | Yu et al. ........................ 438/703 |

*Primary Examiner* — Daborah Chacko Davis
(74) *Attorney, Agent, or Firm* — Marshall, Gerstein & Borun LLP

(57) ABSTRACT

A method for forming fine patterns of a semiconductor device employs a double patterning characteristic using a mask for forming a first pattern including a line pattern and a mask for separating the line pattern, and a reflow characteristic of a photoresist pattern.

11 Claims, 30 Drawing Sheets

METHOD FOR FORMING FINE PATTERNS OF SEMICONDUCTOR DEVICE

CROSS-REFERENCE TO RELATED APPLICATION

The priority benefit of Korean patent application number 10-2008-0057870 filed Jun. 19, 2008, the entire disclosure of which is incorporated by reference, is claimed.

BACKGROUND OF THE INVENTION

The disclosure relates to a method for forming fine patterns of a semiconductor device.

Due to the high degree of integration of semiconductor devices, the resolution required in semiconductor devices is smaller than the minimum resolution (1F) that can be resolved using photolithography equipment.

For example, when the minimum resolution that can be resolved by a single exposure process using the photolithography equipment is 45 nm, a semiconductor device requires a resolution smaller than 40 nm. ("Single exposure process" means an exposure process using one exposure mask.)

In order to overcome limits of the photolithography equipment, various patterning technologies have been developed and suggested.

Of these patterning technologies, double patterning technology divides patterns having a small pitch into two masks and repeating photo and etching processes twice using the two masks to obtain a desired target pattern.

FIG. 1 is a diagram illustrating an active region of a cell region 1000 and a peri/core region 2000 of a DRAM.

Referring to FIG. 1, when it is impossible to form a pattern having a small pitch as shown in A and a space between island patterns as shown in B, which is below a specific space, by a single exposure method using one mask, a conventional double patterning method is performed to divide patterns (the target patterns) of FIG. 1 into two masks and to pattern using the two masks, thereby obtaining a target pattern.

The conventional double patterning method comprises repeating an exposing process twice using two masks, so that an actual pattern has a different size from that of the target pattern depending on mis-alignment of exposure equipment and process change.

SUMMARY OF THE INVENTION

Various embodiments of the disclosure are directed at providing a method for forming fine patterns of a semiconductor device. The fine pattern may have a smaller resolution than the minimum resolution (1F) of photolithography equipment.

According to an embodiment of the disclosure, a method for forming fine patterns of a semiconductor device comprises: forming a first pattern having a line type that connects an active region of a cell region to an upper portion of an underlying layer in a longitudinal direction; forming a spacer insulating film over the resulting structure including the first pattern; forming a planarized gap-fill insulating film that exposes the spacer insulating film; removing the spacer insulating film using the gap-fill insulating film as a mask to form a second pattern between the first pattern; forming a first photoresist pattern that defines a contact hole for separating the first pattern and the second pattern; reducing a critical dimension (CD) of the contact hole; and etching the first pattern and the second pattern using the first photoresist pattern as a mask, and etching the underlying layer using the first and second patterns as a mask.

Preferably, the first pattern is formed by: forming a hard mask layer over the underlying layer; forming a second photoresist pattern over the hard mask layer using a first exposure mask having a shading region having the line type; and etching the hard mask layer using the second photoresist pattern as a mask to pattern the hard mask layer.

Preferably, the spacer insulating film comprises a material having a higher etching selectivity than those of the hard mask layer and the gap-fill insulating film, and the gap-fill insulating film comprises a material having a lower etching selectivity than that of the hard mask layer.

Preferably, the gap-fill insulating film is planarized by an etch-back process or a chemical mechanical polishing process.

Preferably, the first photoresist pattern is formed by: forming a photoresist film over the first pattern and the second pattern; and patterning the photoresist film using a second exposure mask including the contact hole region as a transmitting region.

Preferably, the CD of the contact hole is reduced by a method selected from the group consisting of reflowing the first photoresist pattern, forming a resolution enhancement lithography assisted by chemical shrink (RELACS) material in the first photoresist pattern, and forming a spacer of the first photoresist pattern.

Preferably, the first pattern is formed by: forming a first hard mask layer and a second hard mask layer over the underlying layer; forming a second photoresist pattern over the second hard mask layer using the first exposure mask having a line type shading region; and etching the second hard mask layer using the second photoresist pattern as a mask to pattern the second hard mask layer.

Preferably, the spacer insulating film comprises a material having a higher etching selectivity than those of the first hard mask layer, the second hard mask layer, and the gap-fill insulating film, and the gap-fill insulating film comprises a material having a lower etching selectivity than that of the first hard mask layer.

According to an embodiment of the disclosure, a method for forming fine patterns of a semiconductor device comprises: forming a first pattern having a line type that connects an active region of a cell region over an underlying layer in a longitudinal direction; forming a spacer insulating film over the resulting structure including the first pattern; forming a planarized gap-fill insulating film that exposes the spacer insulating film; removing the spacer insulating film using the gap-fill insulating film as a mask to form a second pattern between the first pattern; forming a first photoresist pattern that defines a contact hole for separating the first pattern and the second pattern in the cell region and defines an active region in a peripheral circuit region; reducing a critical dimension (CD) between the first photoresist pattern; and etching the first pattern and the second pattern of the cell region, and the spacer insulating film and the gap-fill insulating film of the peripheral circuit region using the first photoresist pattern as a mask, and etching the underlying layer using the first pattern, the second pattern, the spacer insulating film, and the gap-fill insulating film as a mask.

Preferably, the first pattern is formed by: forming a hard mask layer over the underlying layer; forming a second photoresist pattern over the hard mask layer using a first exposure mask having a line-type shading region; and etching the hard mask layer using the second photoresist pattern as a mask to pattern the hard mask layer.

DETAILED DESCRIPTION OF SPECIFIC EMBODIMENT

The disclosure provides a method for forming patterns in a cell region using a spacer depositing and spacer removing and forming a patterns in a peripheral region (or core region) using a reflow characteristic, that is, a resist shrink characteristic of a photoresist film using a double patterning process.

The disclosed method for forming a semiconductor device is described in detail below using reference to the accompanying drawings.

Figure 1:
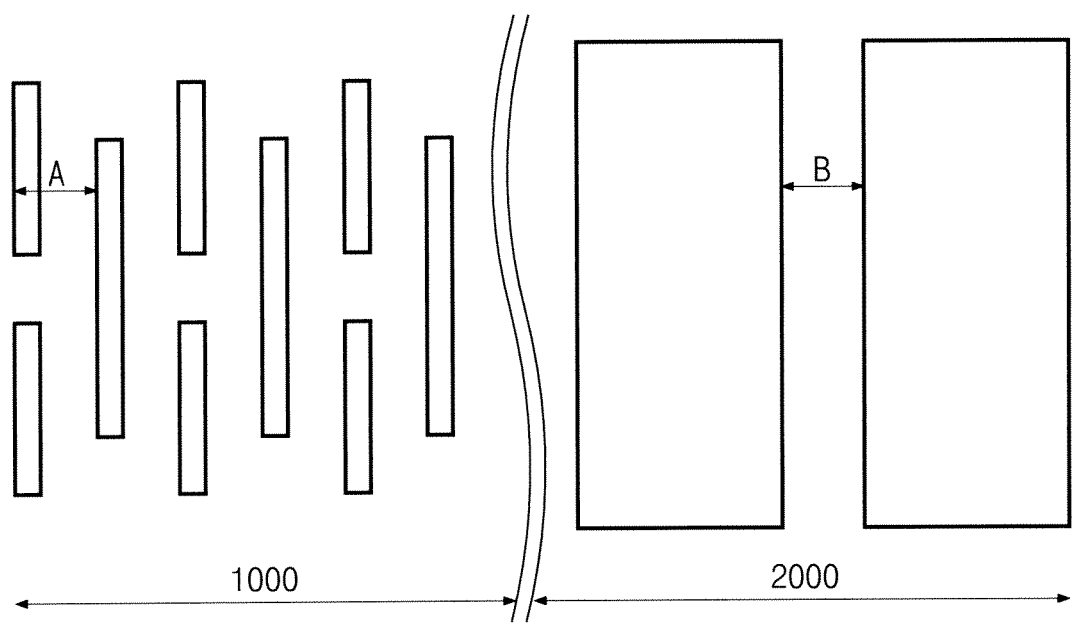
FIG. 1 is a plan view illustrating a conventional fine pattern of a semiconductor device.
Figure 2A:
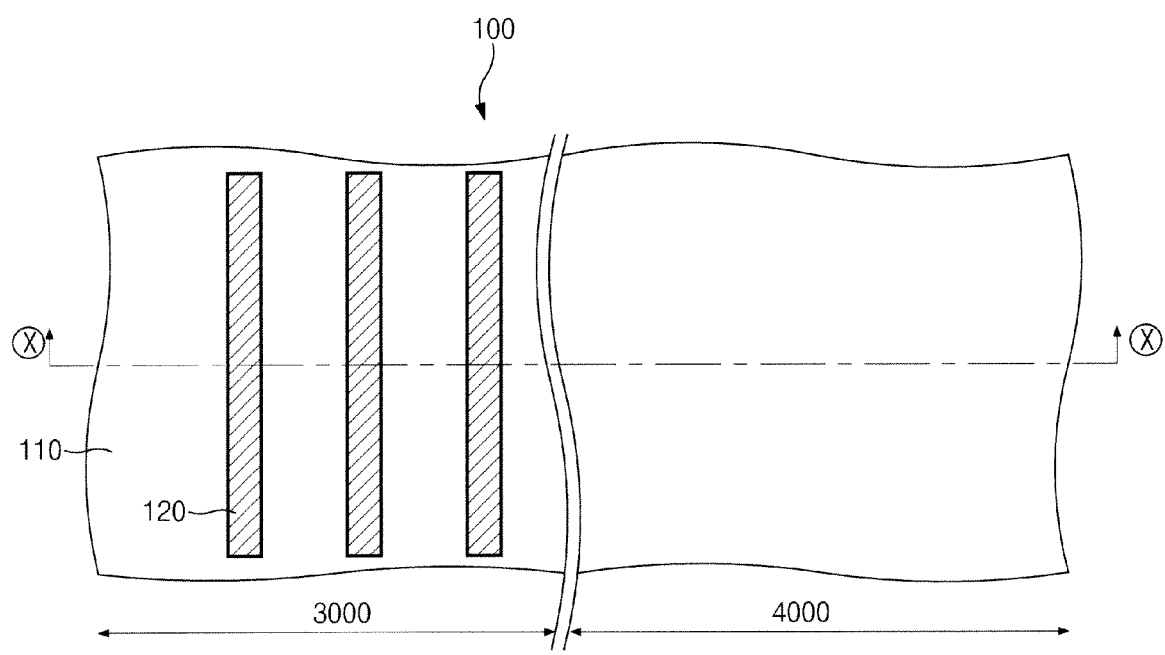
FIGS. 2a and 2b are plan views illustrating an exposure mask used in first and third embodiments of the disclosure.
Figure 2B:
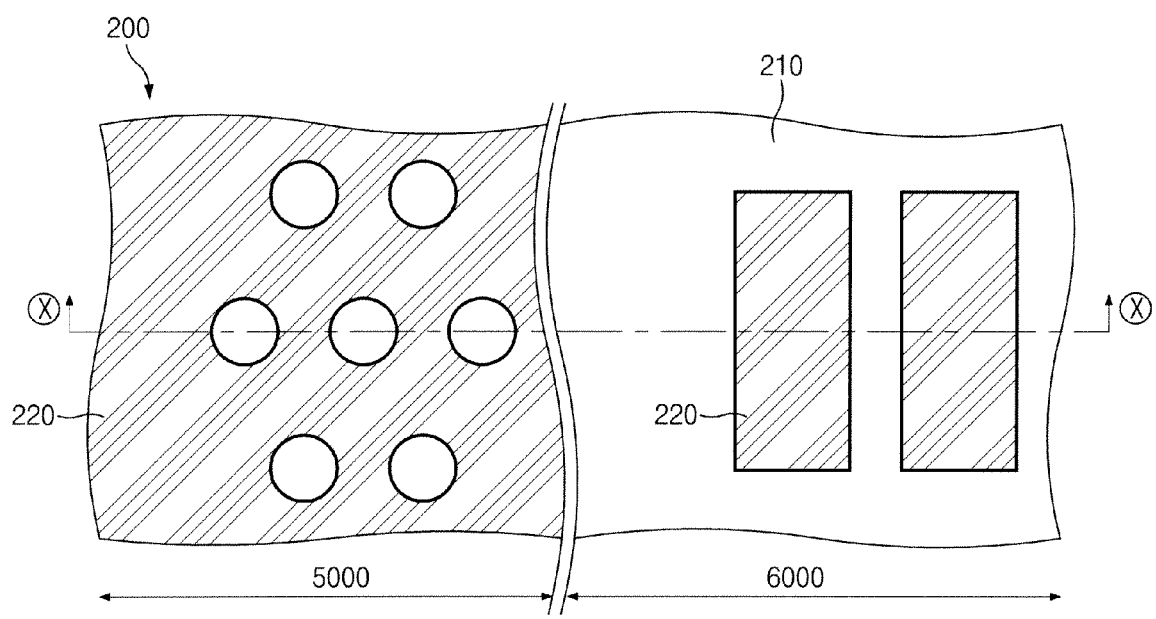

FIGS. 2a and 2b are plan views illustrating first and second exposure masks used in first embodiments of the disclosure.

In a first exposure mask 100, a shading pattern 120 for forming a line pattern in a cell region 3000 is formed with a line type over a quartz substrate 110. The shading pattern 120 is formed to have the same size as a critical dimension (CD) of an active region in a longitudinal direction of the active region. No patterns are formed in a peripheral circuit region 4000.

In a second exposure mask 200, line patterns of a cell region 5000 are separated to form an active region while a shading pattern 220 for shading an active region of a peripheral circuit region 600 is formed over a quartz substrate 210.

FIGS. 3a to 3i and FIGS. 4a to 4c are diagrams illustrating a process of patterning the active regions in a cell region 10000 and a peripheral circuit region (or core region) 20000 using the first exposure mask 100 of FIG. 2a and the second exposure mask 200 of FIG. 2b. The cross-sectional diagrams of FIGS. 3a to 3i are take along line x-x of the first and second exposure masks 100 and 200.

Figure 3A:
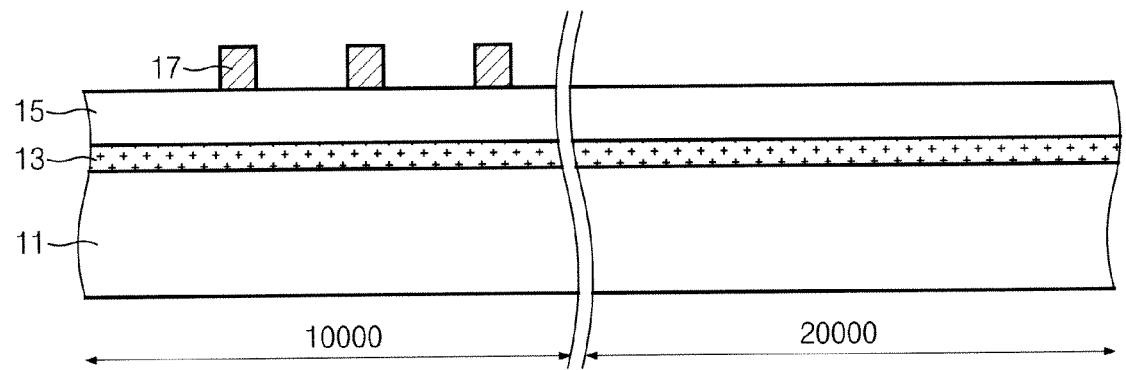
FIGS. 3a to 3i and FIGS. 4a to 4c are cross-sectional and plan views illustrating a method for forming a fine pattern of a semiconductor device according to an embodiment of the disclosure.
Figure 3B:
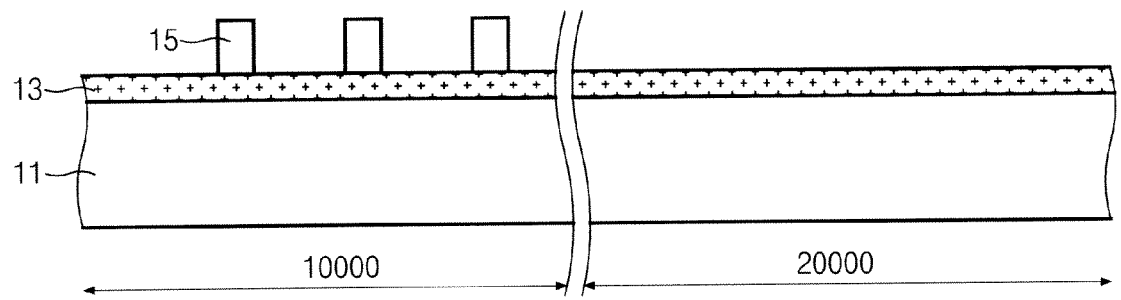

Referring to FIGS. 3a and 3b, a first hard mask layer 13 and a second hard mask layer 15 are sequentially formed over a semiconductor substrate 11 including an underlying layer (not shown). The first hard mask layer 13 comprises an insulating material having a lower etching selectivity than that of the second hard mask layer 15.

A photoresist pattern 17 is formed over the second hard mask layer 15.

Specifically, a photoresist film is coated over the second hard mask layer 15, exposed and developed using the first exposure mask 100 of FIG. 2a, thereby obtaining the photoresist pattern 17. The photoresist pattern 17 is formed only in the cell region 10000 with a line type along a longitudinal direction of the active region.

The second hard mask layer 15 is etched until the first hard mask layer 13 is exposed using the photoresist pattern 17 as a mask, thereby obtaining a second hard mask layer 15 pattern. Generally, the photoresist pattern 17 is completely removed by the etching process. However, when the photoresist pattern 17 remains, the remaining photoresist pattern 17 is removed.

Figure 3C:
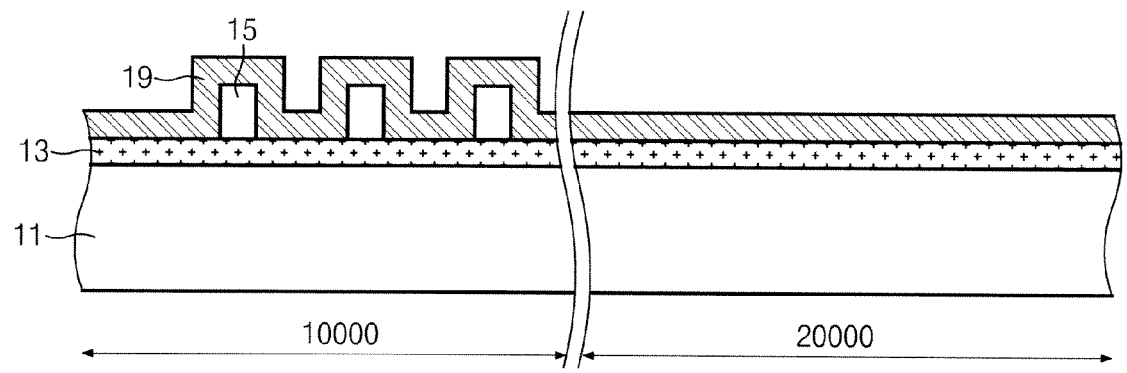

Referring to FIG. 3c, a spacer insulating film 19 is formed over the second hard mask layer 15 pattern and the first hard mask layer 13. The spacer insulating film 19 is formed both in the cell region 10000 and in the peripheral circuit region 20000.

Figure 3D:
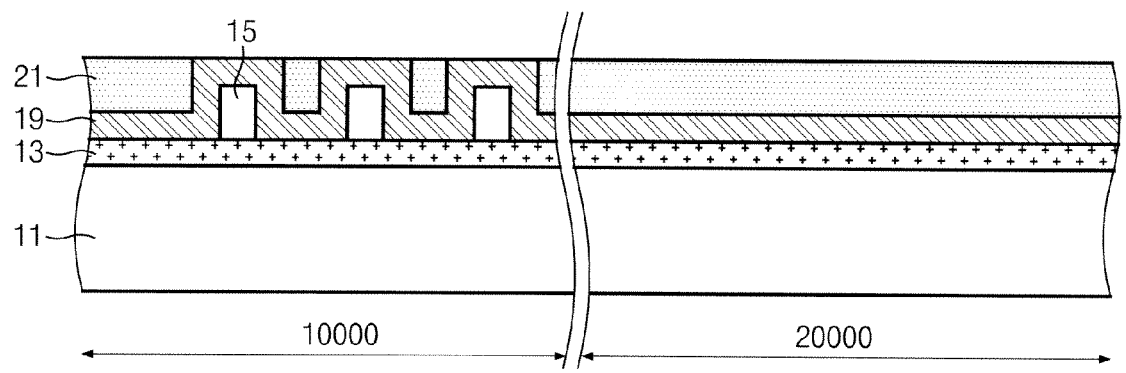

The spacer insulating film 19 comprises an insulating material having a higher etching selectivity than those of the first hard mask layer 13, the second hard mask layer 15 pattern, and a gap-fill insulating film 21 (see FIG. 3d).

Referring to FIG. 3d, a gap-fill insulating film 21 is formed over the spacer insulating film 19. The gap-fill insulating film 21 is planarized until the spacer insulating film 19 located over the second hard mask layer 15 pattern is exposed, thereby obtaining a gap-fill insulating pattern.

The gap-fill insulating film 21 comprises a material having a lower etching selectivity than that of the first hard mask layer 13. The gap-fill insulating film 21 has the same or similar etching selectivity to that of the second hard mask layer 15 pattern.

The gap-fill insulating film 21 that fills a space between the spacer insulating films 19 is positioned between the second hard mask layer 15 patterns.

The gap-fill insulating film 21 is planarized by an etch-back process or a chemical mechanical polishing process.

Figure 3E:
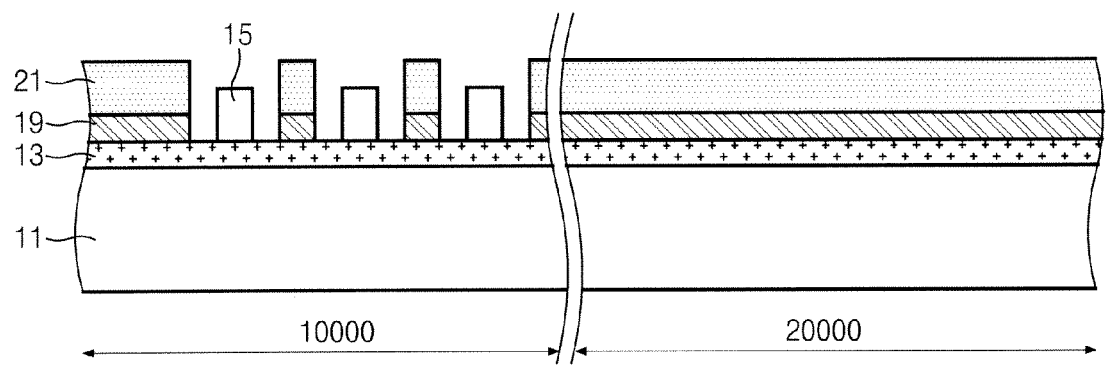

Referring to FIG. 3e, the spacer insulating film 19 is etched using the gap-fill insulating film 21 pattern as an etching mask and using the first hard mask layer 13 and the second hard mask layer 15 pattern as an etching barrier.

The gap-fill insulating film 21 pattern remains between the second hard mask layer 15 patterns using a stacked structure over the un-etched spacer insulating film 19.

Figure 3F:
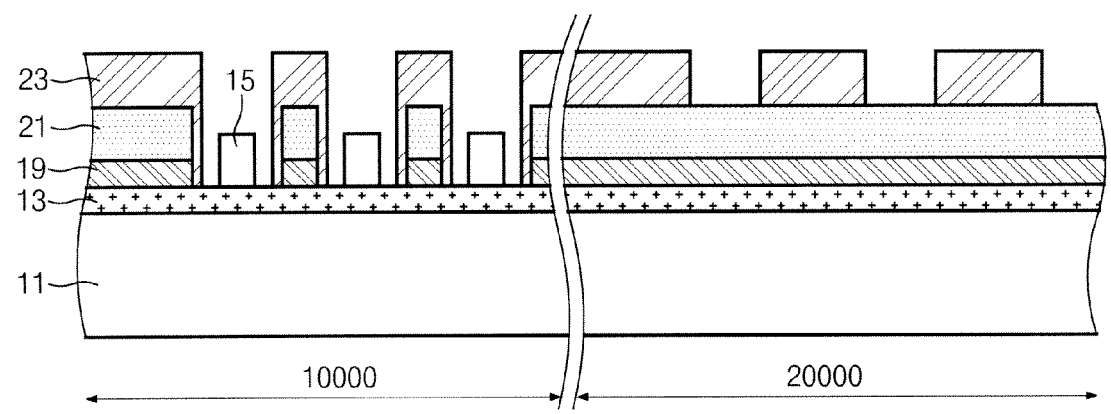

Referring to FIG. 3f, a photoresist pattern 23 is formed. Specifically, a photoresist film is coated over the resulting structure of FIG. 3e, and an exposing and developing process is performed using the second exposure mask 200 of FIG. 2c, thereby obtaining the photoresist pattern 23. In the second exposure mask 200, a shading pattern 220 for forming a contact hole in the cell region 10000 and forming an active region in the peripheral circuit region 20000 is forming over the quartz substrate 210.

The photoresist pattern 23 partially exposes the second hard mask layer 15 pattern or the gap-fill insulating film 21 pattern in the cell region 10000, and is formed using an island type over the active region to have the minimum interval (F) in the peripheral circuit region 20000.

Figure 3G:
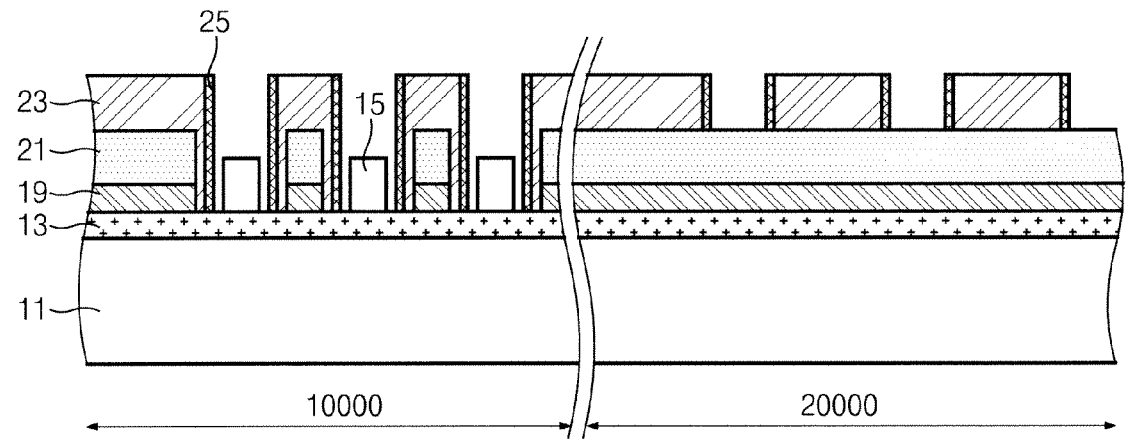
Figure 4A:
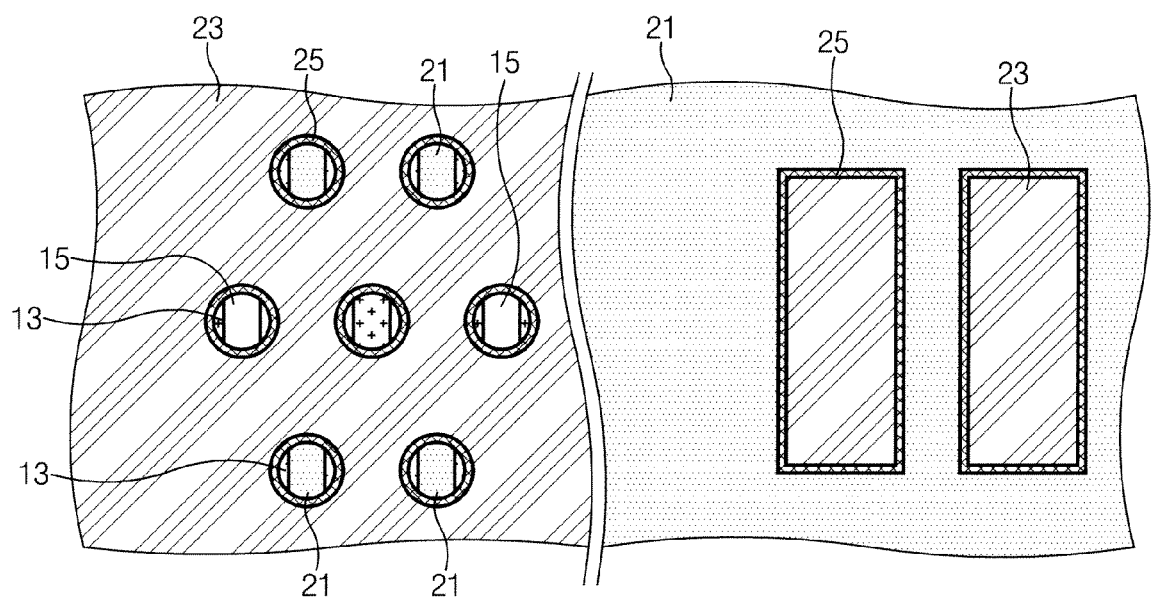

Referring to FIGS. 3g and 4a, the photoresist pattern 23 is reflowed to form a reflowed photoresist pattern 25. In the reflowed photoresist pattern 25, the contact hole is formed to have a decreased size in the cell region 10000, and the photoresist pattern 23 is formed to have an increased size in the peripheral circuit region 20000, so that an interval between the photoresist patterns 23 becomes smaller than the minimum interval (F).

The process of reflowing the photoresist pattern 25 may be replaced using a process of forming a RELACS (resolution enhancement lithography assisted by chemical shrink) material over the photoresist pattern 25 or of forming a spacer at sidewalls of the photoresist pattern 23. The reflowed photoresist pattern 25 is formed so that an interval between the patterns can be smaller than the minimum interval using photolithography equipment.

Figure 3H:
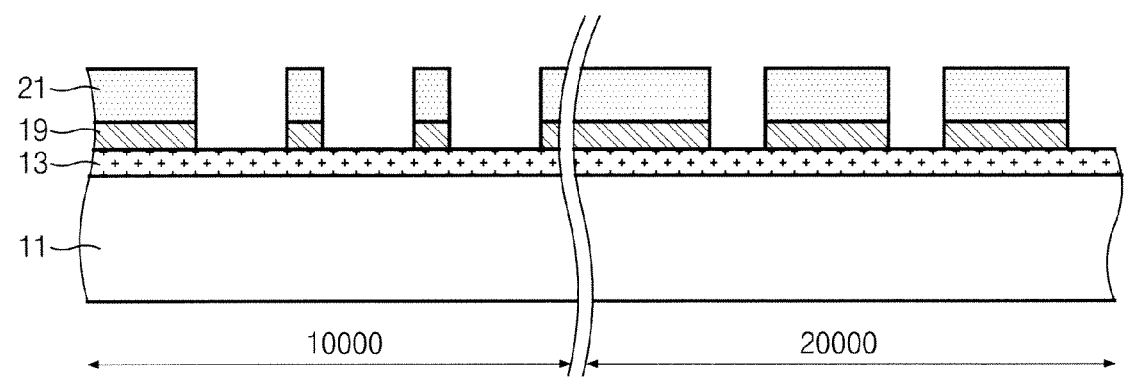
Figure 4B:
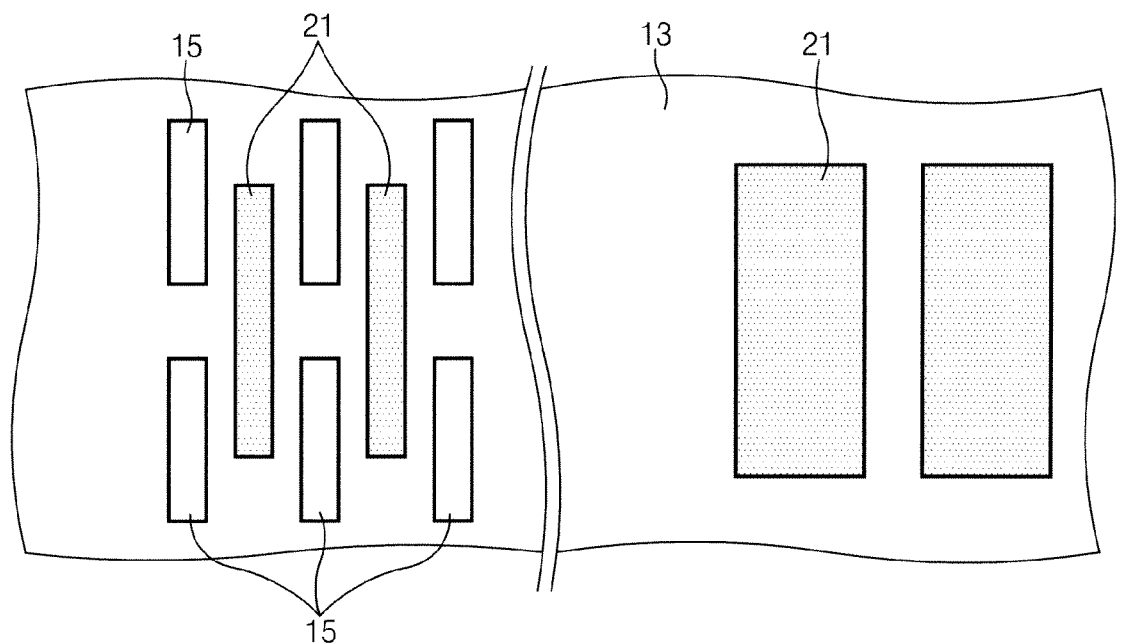

Referring to FIGS. 3h and 4b, the gap-fill insulating film 21 pattern, the second hard mask layer 15 pattern, and the spacer insulating film 19 are etched using the photoresist pattern 23 and the reflowed photoresist pattern 25 as a mask. As a result, a stacked structure including the spacer insulating film 19 and the gap-fill insulating film 21, and the second hard mask layer 15 pattern are formed over the active region of the cell region 10000 and the peripheral circuit region 20000, as shown in FIG. 4b.

When the reflowed photoresist pattern 25 remains, an additional removing process is performed to remove the residual photoresist pattern 25.

Figure 3I:
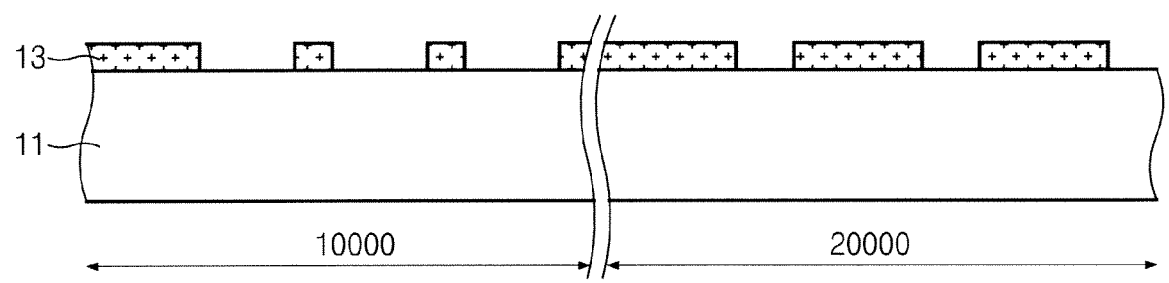
Figure 4C:
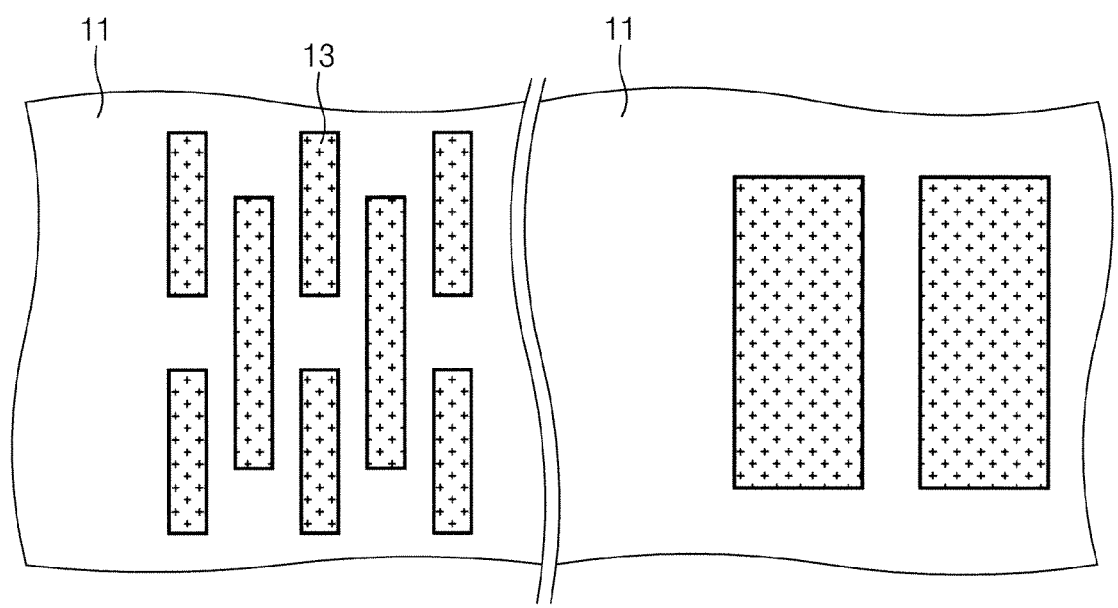

Referring to FIGS. 3i and 4c, the first hard mask layer 13 is etched using the stacked structure including the spacer insulating film 19 and the gap-fill insulating film 21, and the second hard mask pattern as a mask, thereby obtaining a first hard mask layer 13 pattern. The stacked structure including the spacer insulating film 19 and the gap fill insulating film 21, and the second hard mask pattern are removed.

As a subsequent process, the underlying layer (not shown) is etched using the first hard mask layer 13 pattern as a mask, thereby obtaining a fine underlying pattern.

Figure 5A:
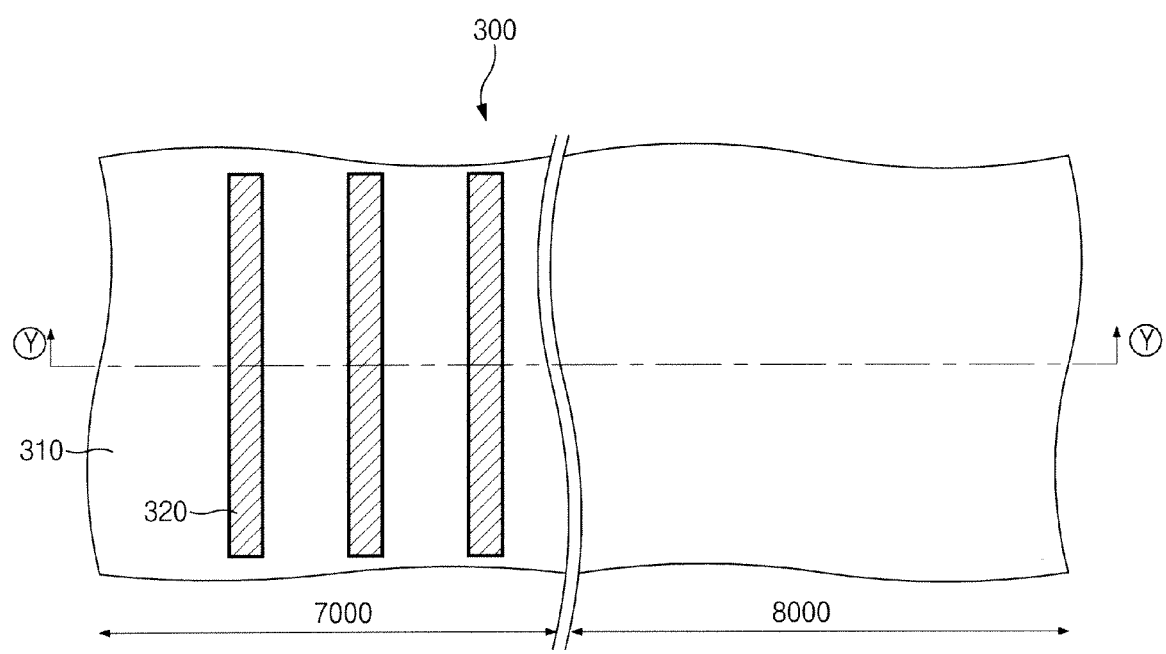
FIGS. 5a to 5c are plan views illustrating an exposure mask used in a second embodiment of the disclosure.
Figure 5B:
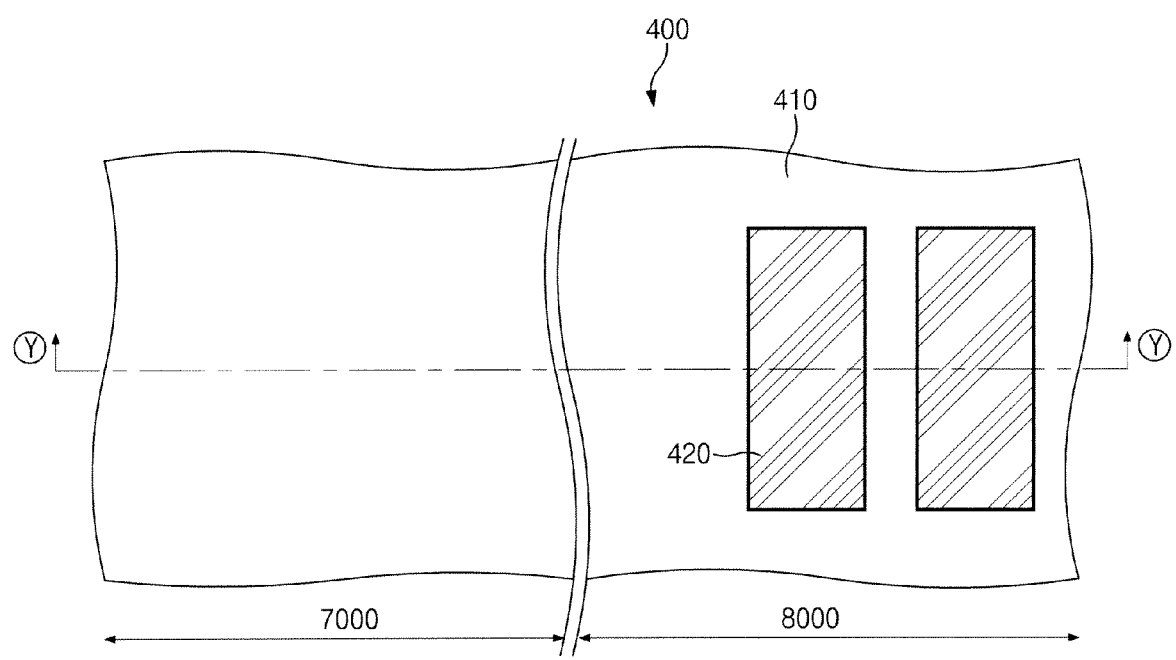
Figure 5C:
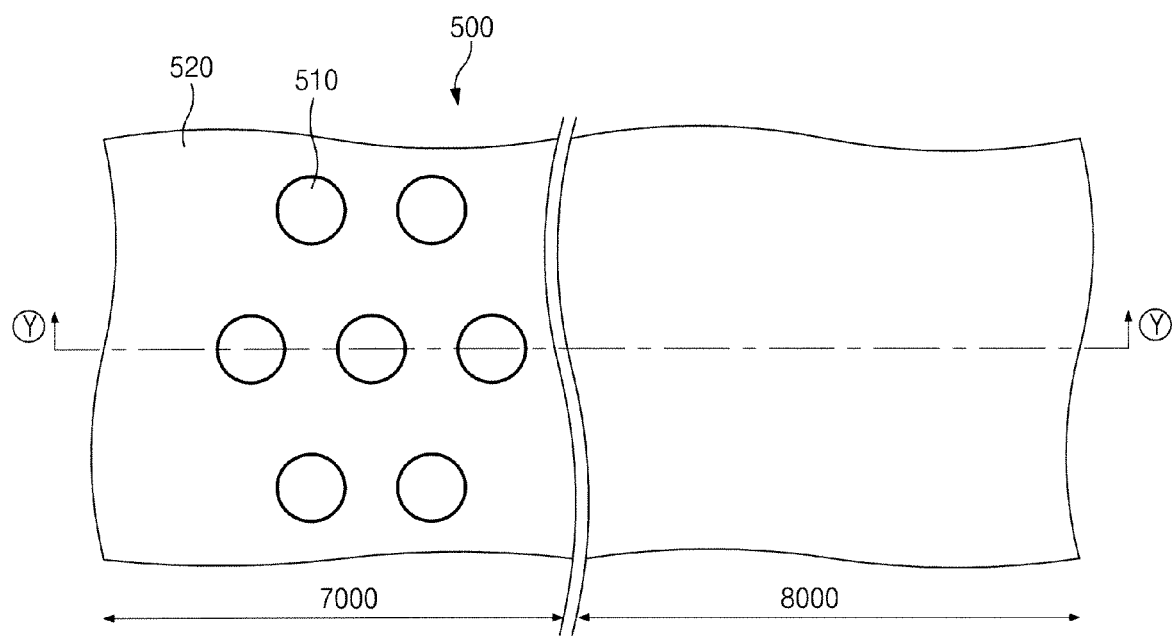

FIGS. 5a to 5c are plan views illustrating first to third exposure masks used in a second embodiment of the disclosure.

In a first exposure mask 300, a shading pattern 320 for forming a line pattern in a cell region 7000 is formed with a line type over a quartz substrate 310. The shading pattern 320 is formed to have the same size as a CD of an active region in a longitudinal direction. No patterns are formed in a peripheral circuit region 8000.

In a second exposure mask 400, a shading pattern 420 for shading the cell region 700 and the active region of the peripheral circuit region 8000 is formed over a quartz substrate 410. No patterns are formed in the cell region 700.

In a third exposure mask 500, a shading pattern 520 for separating the line pattern of the cell region 7000 and shading the peripheral circuit region 8000 is formed over a quartz substrate 510.

FIGS. 6a to 6j and FIGS. 7a to 7e are cross-sectional and plan views illustrating a process of patterning the active region in a cell region 30000 and a peripheral circuit region (or core region) 40000 using the first to third exposure masks 300, 400 and 500. FIGS. 6a to 6j are diagrams taken along line y-y of the first to third exposure masks 300, 400 and 500. FIGS. 7a to 7e show plan views of FIGS. 6e to 6g, and 6i to 6j.

Figure 6A:
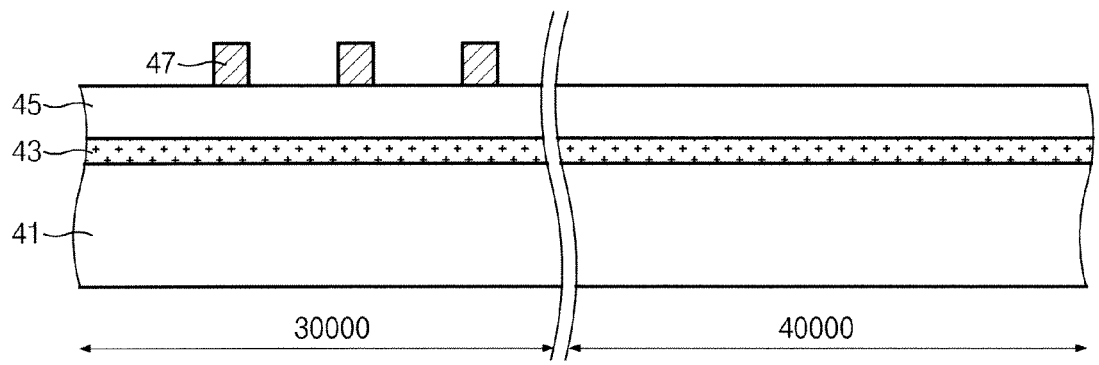
FIGS. 6a to 6j and FIGS. 7a to 7e are cross-sectional and plan views illustrating a method for forming a fine pattern of a semiconductor device according to the second embodiment of the disclosure.
Figure 6B:
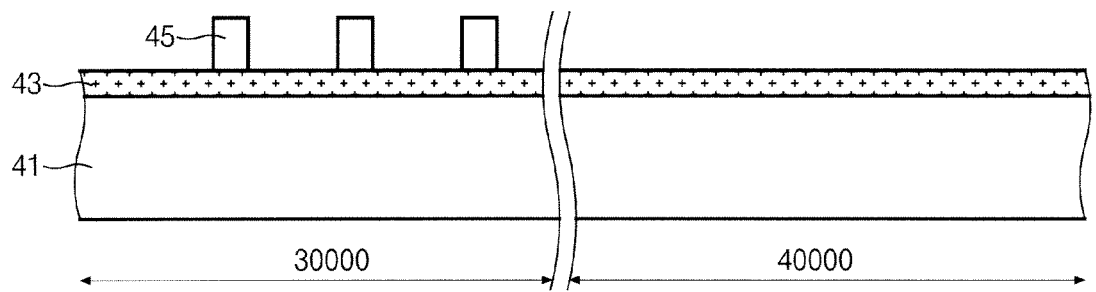

Referring to FIGS. 6a and 6b, a first hard mask layer 43 and a second hard mask layer 45 are sequentially formed over a semiconductor substrate 41 including an underlying layer (not shown). The first hard mask layer 43 comprises an insulating material having a lower etching selectivity than that of the second hard mask layer 45 and a spacer insulating film 49 of FIG. 6c.

A photoresist pattern 47 is formed over the second hard mask layer 45. Specifically, a photoresist film is coated over the second hard mask layer 45, exposed and developed using the first exposure mask 300 of FIG. 5a, thereby obtaining the photoresist pattern 47. The photoresist pattern 47 is formed only in the cell region 30000 with a line type along a longitudinal direction of the active region.

The second hard mask layer 45 is etched until the first hard mask layer 43 is exposed using the photoresist pattern 47 as a mask, thereby obtaining a second hard mask layer 45 pattern. Generally, the photoresist pattern 17 is completely removed by the etching process. However, when the photoresist pattern 17 remains, the remaining photoresist pattern 17 is removed.

Figure 6C:
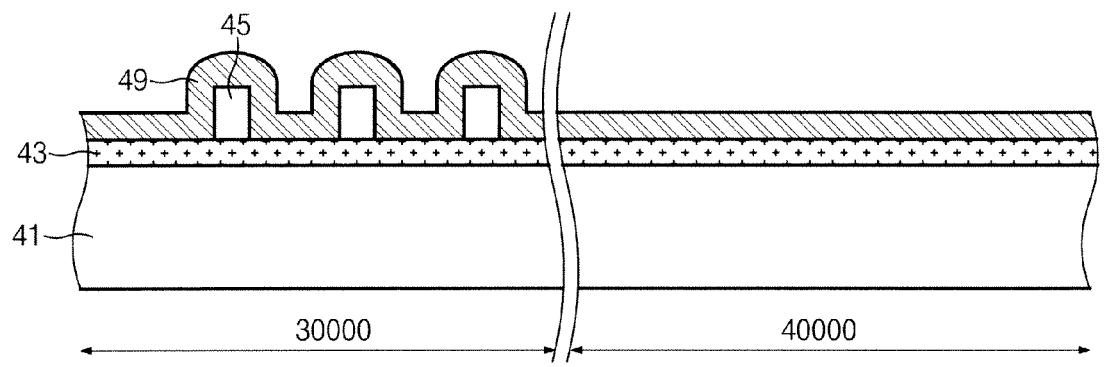

Referring to FIG. 6c, a spacer insulating film 49 is formed over the second hard mask layer 45 pattern and the first hard mask layer 43. The spacer insulating film 49 is formed both in the cell region 30000 and in the peripheral circuit region 40000.

The spacer insulating film 49 comprises an insulating material having a higher etching selectivity than that of the first hard mask layer 43 and the second hard mask layer 45 pattern.

Figure 6D:
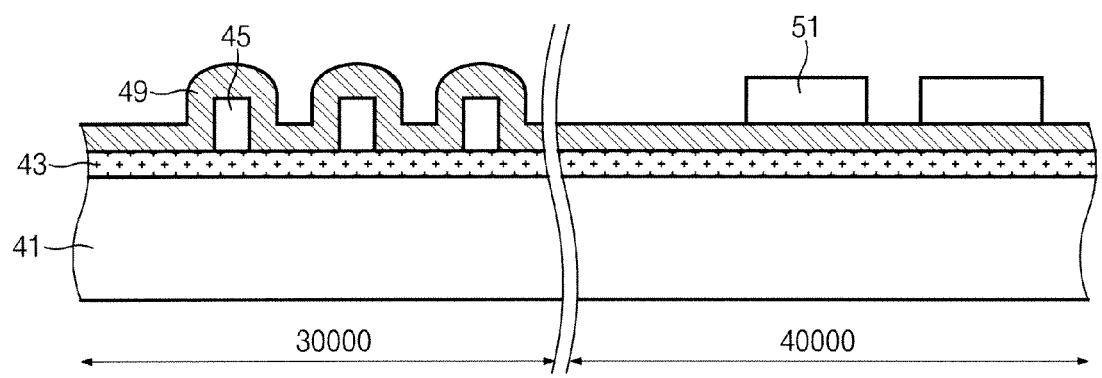

Referring to FIG. 6d, a second photoresist film is coated over the spacer insulating film 49, exposed and developed using the second exposure mask 400 of FIG. 5b, thereby obtaining a photoresist pattern 51. The photoresist pattern 51 is formed only in the peripheral circuit region 40000.

Figure 6E:
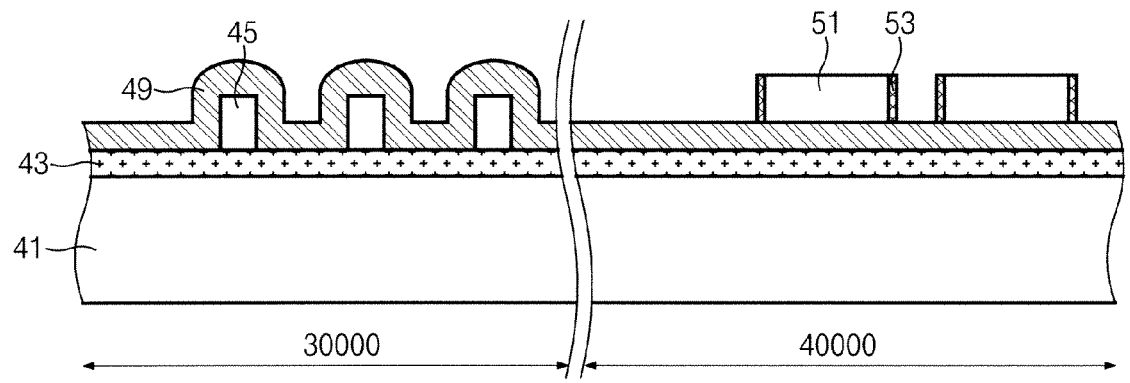
Figure 7A:
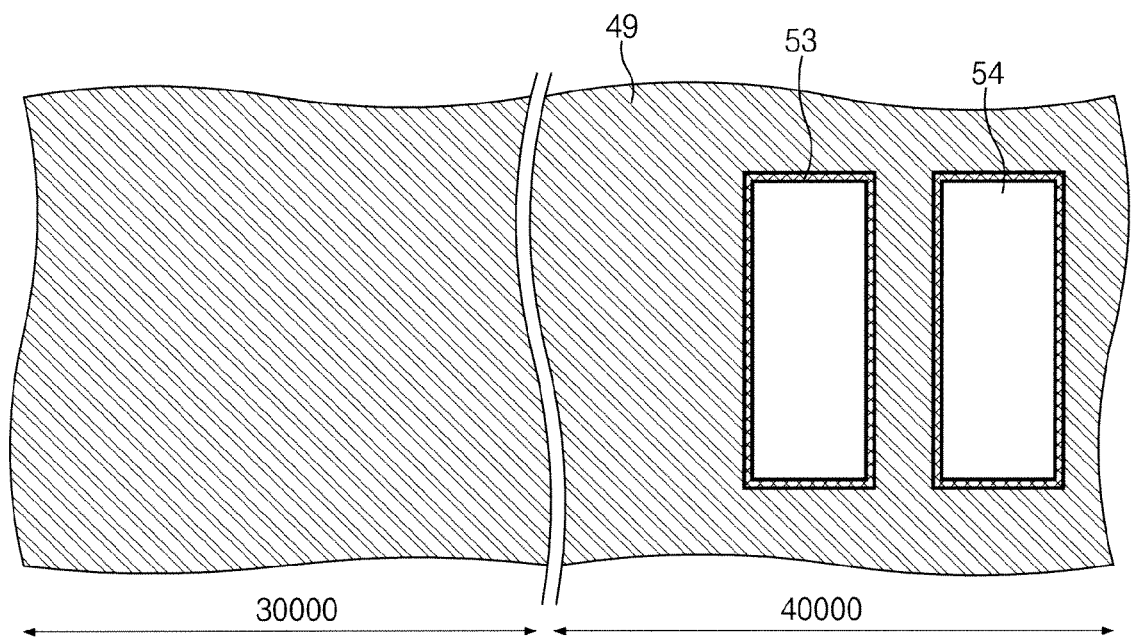

Referring to FIGS. 6e and 7a, the photoresist pattern 51 is reflowed to form a reflowed photoresist pattern 53 at sidewalls of the photoresist pattern 51. The reflowed photoresist pattern 53 increases the size of the photoresist pattern 51 of the peripheral circuit region 40000, so that an interval between the photoresist pattern 51 becomes smaller than the minimum interval (F).

The process of reflowing the photoresist pattern 53 may be replaced using a process of forming a RELACS material over the photoresist pattern 53 or of forming a spacer at sidewalls of the photoresist pattern 51. The reflowed photoresist pattern 53 is formed so that an interval between the patterns can be smaller than the minimum interval.

Figure 6F:
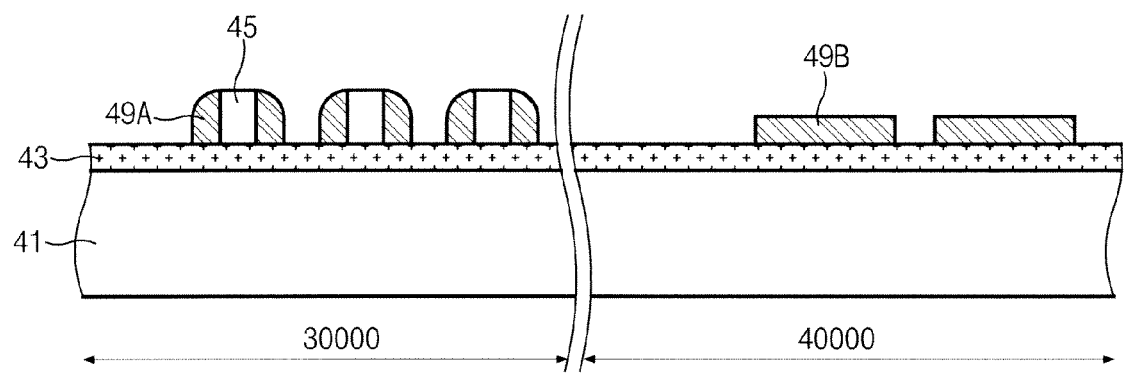
Figure 7B:
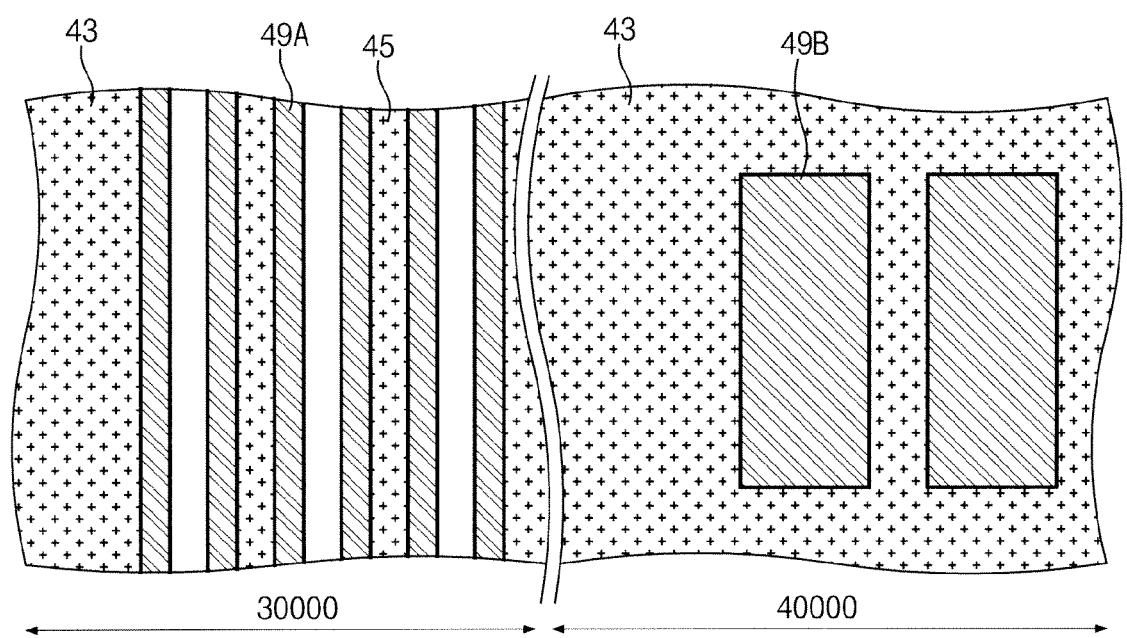

Referring to FIGS. 6f and 7b, the spacer insulating film 49 is isotropic-etched using the photoresist pattern 51 and the reflowed photoresist pattern 53 as a mask and using the second hard mask layer 45 pattern and the first hard mask layer 43 as an etching barrier. As a result, a spacer 49A is formed at sidewalls of the second hard mask pattern, and a spacer insulating film pattern 49B is formed in the peripheral circuit unit 40000.

Figure 6G:
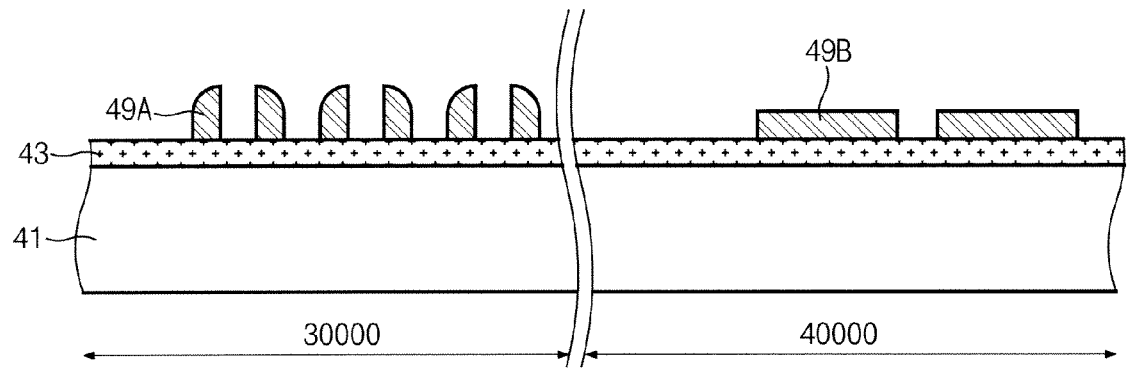
Figure 7C:
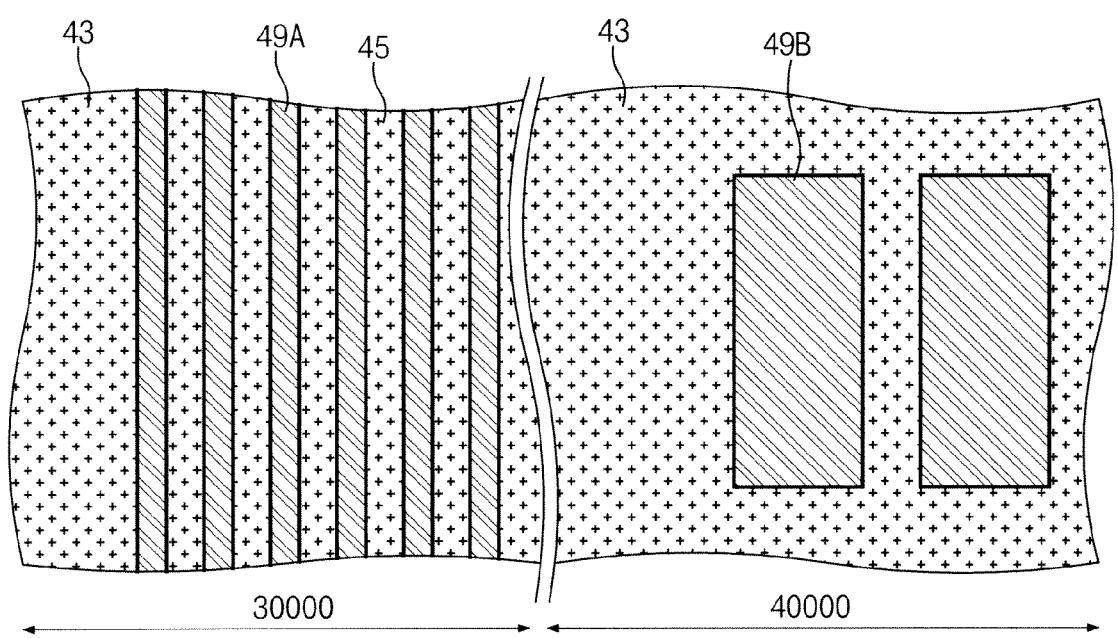

Referring to FIGS. 6g and 7c, the second hard mask pattern is removed.

Figure 6H:
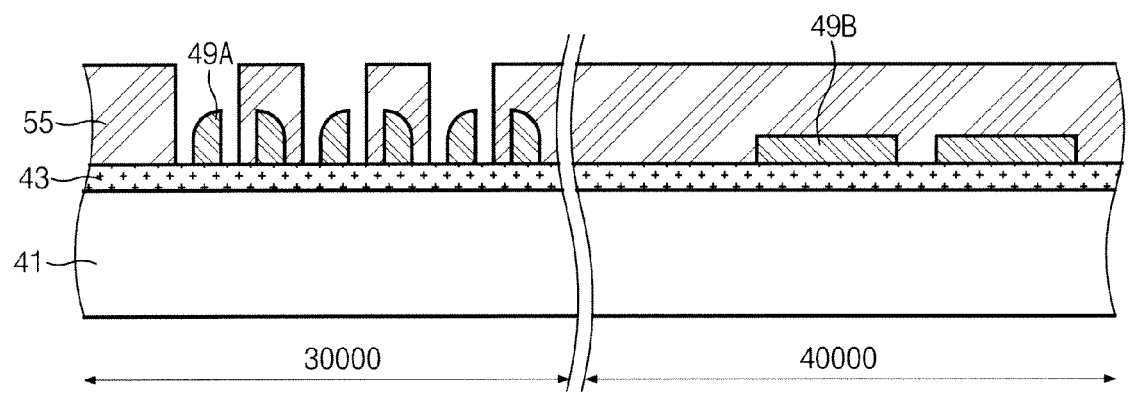

Referring to FIG. 6h, a photoresist film is coated over the resulting structure of FIG. 6f, exposed and developed using the third exposure mask 500 of FIG. 5c, thereby obtaining a photoresist film 55.

The third exposure mask 500 exposes the spacer 49A formed in a region except the active region so that the spacer 49A remains only over the active region.

Figure 6I:
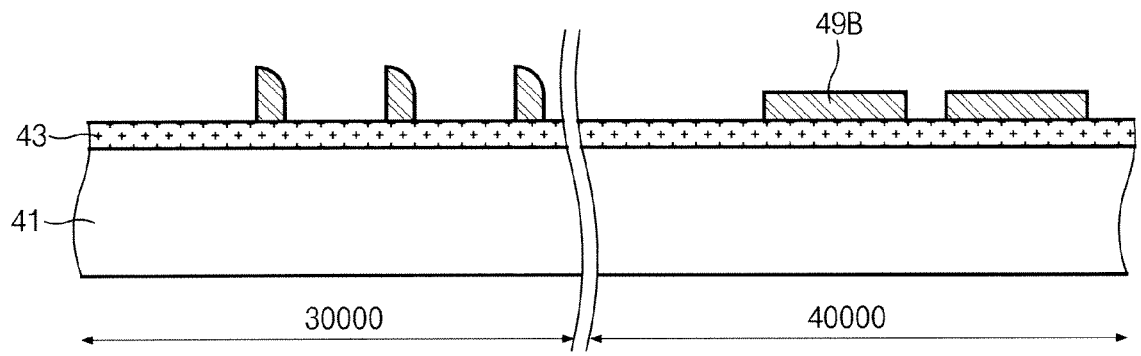
Figure 7D:
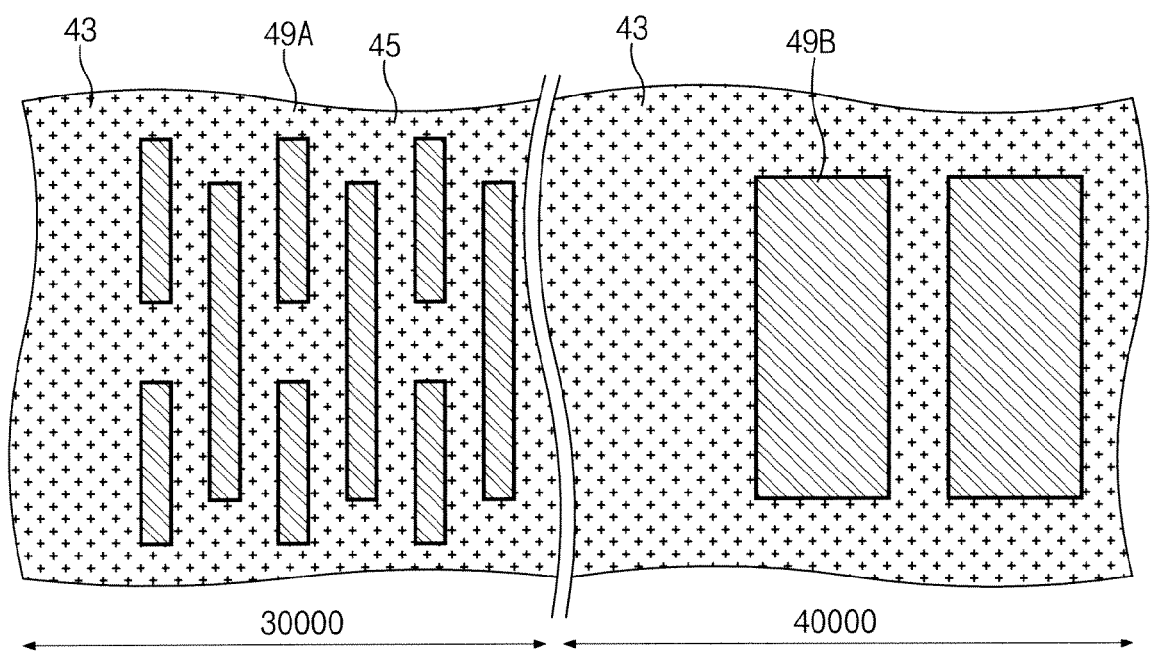

Referring to FIGS. 6i and 7d, after the exposed spacer 49A exposed using the photoresist pattern 55 as a mask is removed, the photoresist pattern 55 is removed. As a result, the spacer 49A is formed only over the active region of the cell region 30000, and the spacer insulating pattern 49B is formed over the active region of the peripheral circuit region 40000.

Figure 6J:
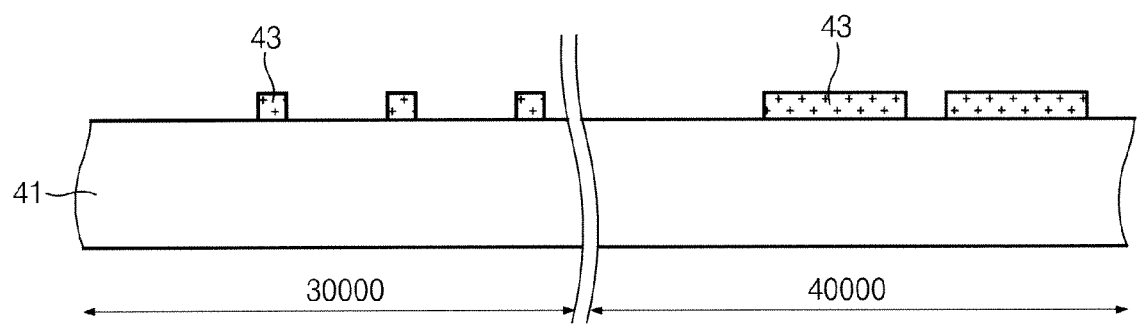
Figure 7E:
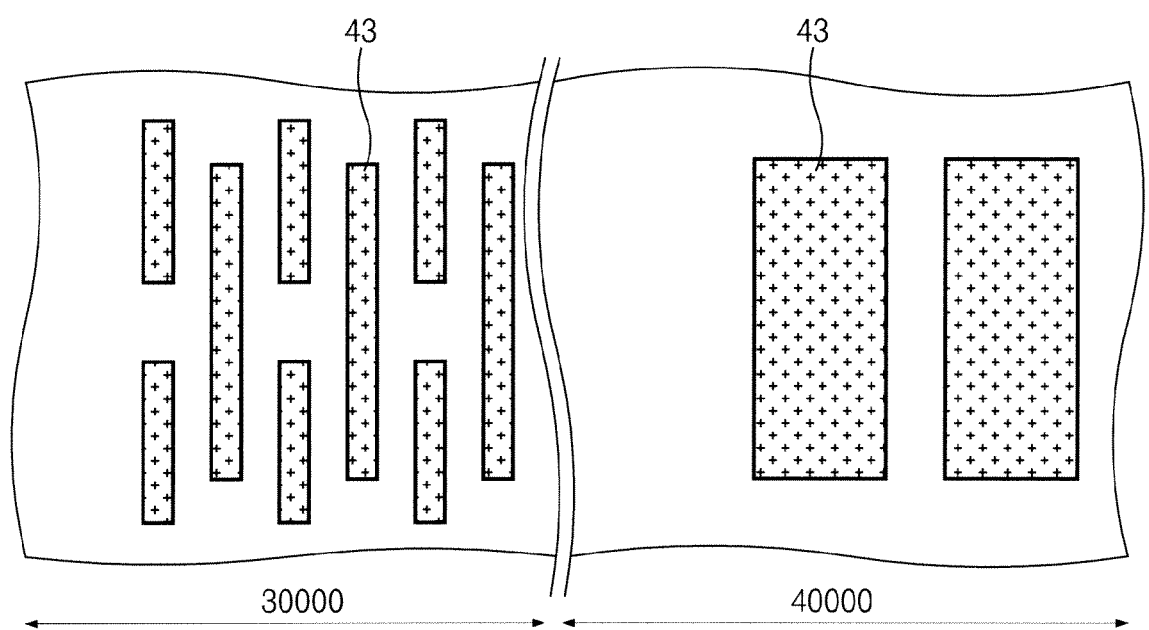

Referring to FIG. 6j and 7e, the first hard mask layer 43 is etched using the spacer 49A and the spacer insulating pattern 49B as a mask. The spacer 49A and the spacer insulating pattern 49B are removed to form a first hard mask layer pattern 43.

The underlying layer (not shown) is etched using the first hard mask layer pattern 43 as a mask to obtain a fine underlying pattern.

FIGS. 8a to 8i and FIGS. 9a to 9c are diagrams illustrating a process of forming active regions in a cell region 50000 and a peripheral circuit region (or core region) 60000 using the first exposure mask 100 of FIG. 2a and the exposure mask 200 of FIG. 2b. FIGS. 8a to 8i show cross-sectional views taken along line x-x of the first and second exposure masks 100 and 200.

Figure 8A:
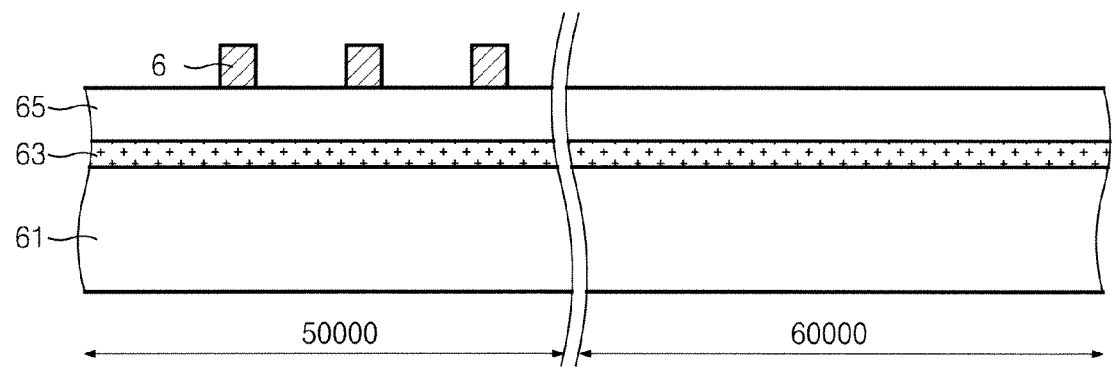
FIGS. 8a to 8i and FIGS. 9a to 9c are cross-sectional and plan views illustrating a method for forming a fine pattern of a semiconductor device according to the third embodiment of the disclosure.
Figure 8B:
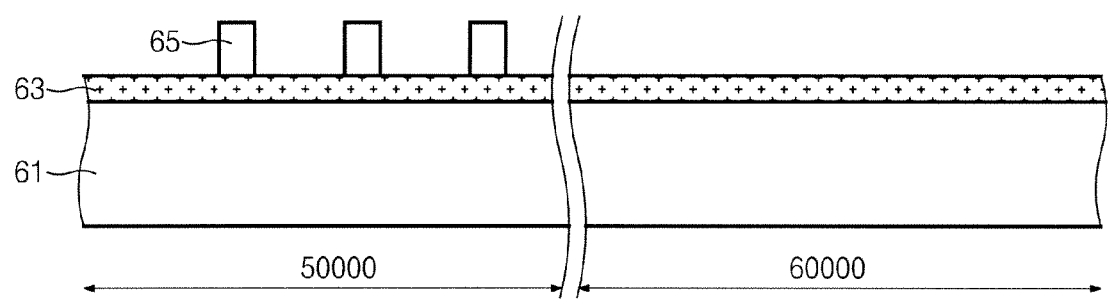

Referring to FIGS. 8a and 8b, a first hard mask layer 63 and a second hard mask layer 65 are sequentially formed over a semiconductor substrate 61 including an underlying layer (not shown). The first hard mask layer 63 comprises an insulating material having a lower etching selectivity than that of the second hard mask layer 65.

A photoresist pattern 67 is formed over the second hard mask layer 65.

Specifically, a photoresist film is coated over the second hard mask layer 65, exposed and developed using the first exposure mask 100 of FIG. 2a, thereby obtaining the photoresist pattern 67. The photoresist pattern 67 is formed to have a line type along a longitudinal direction of the active region.

The second hard mask layer 65 is etched using the photoresist pattern 67 as a mask until the first hard mask layer 63 is exposed, thereby obtaining a second hard mask layer 65 pattern. Generally, the photoresist pattern 67 is completely removed by the etching process. However, when the photoresist pattern 67 remains, the remaining photoresist pattern 67 is removed.

Figure 8C:
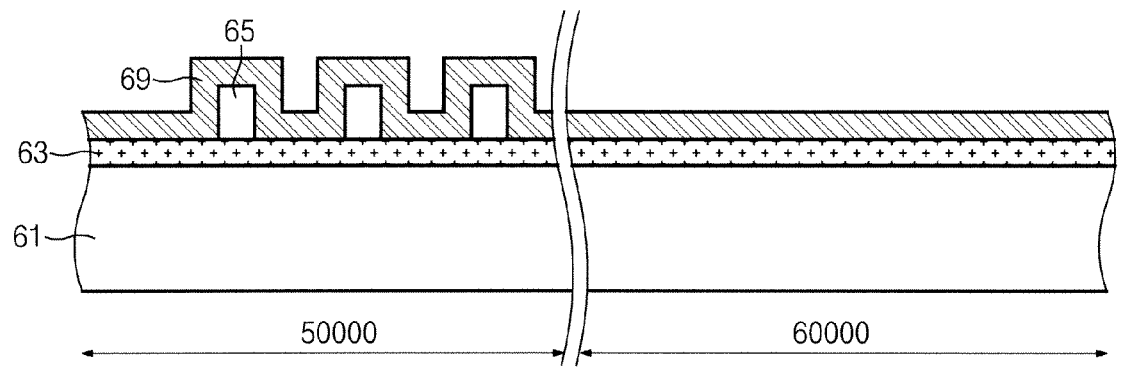

Referring to FIG. 8c, a spacer insulating film 69 is formed over the second hard mask layer 65 pattern and the first hard mask layer 63. The spacer insulating film 69 is formed both in the cell region 50000 and the peripheral circuit region 60000.

Figure 8D:
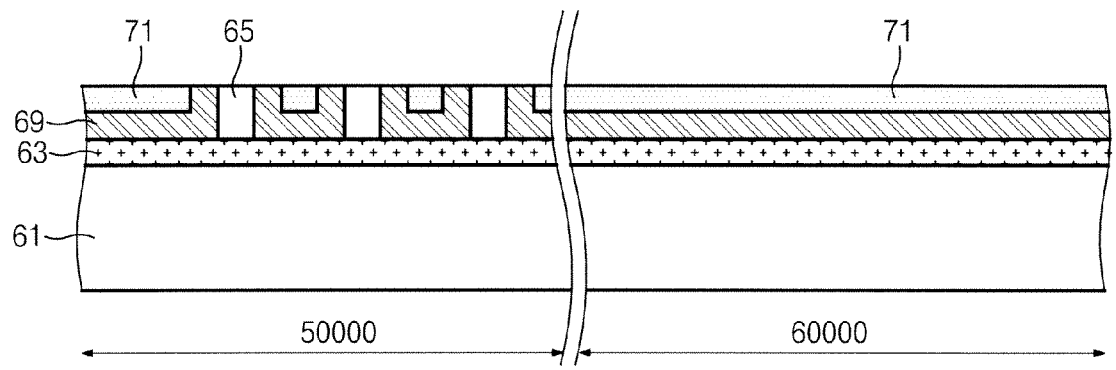

The spacer insulating film 69 comprises an insulating material having a higher etching selectivity than that of the first hard mask layer 63, the second hard mask layer 65 pattern and a gap-fill insulating film 71 of FIG. 8d.

Referring to FIG. 8d, the gap-fill insulating film 71 is formed over the spacer insulating film 69. The gap-fill insulating film 71 and the spacer insulating film 69 are planarized until the second hard mask pattern is exposed, thereby obtaining a gap-fill insulating film 71 pattern. The gap-fill insulating film 71 comprises a material having a lower etching selectivity than that of the first hard mask layer 63. The gap-fill insulating film 71 has the same or similar etching selectivity to that of the second hard mask pattern.

The gap-fill insulating film 71 that fills a space between the spacer insulating films 69 is positioned between the second hard mask layer 65 patterns.

The spacer insulating film 69 is planarized by an etch-back process or a chemical mechanical polishing process.

Figure 8E:
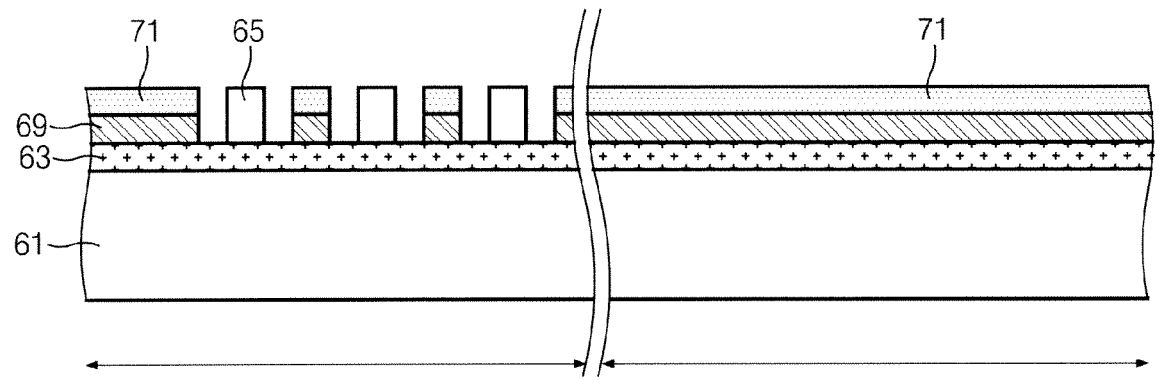

Referring to FIG. 8e, the spacer insulating film 69 is etched using the gap-fill insulating film 71 pattern as a mask and using the first hard mask layer 63 and the second hard mask layer 65 pattern as an etching barrier.

The gap-fill insulating pattern remains between the second hard mask layer 65 patterns using a stacked type over the un-etched spacer insulating film 69.

Figure 8F:
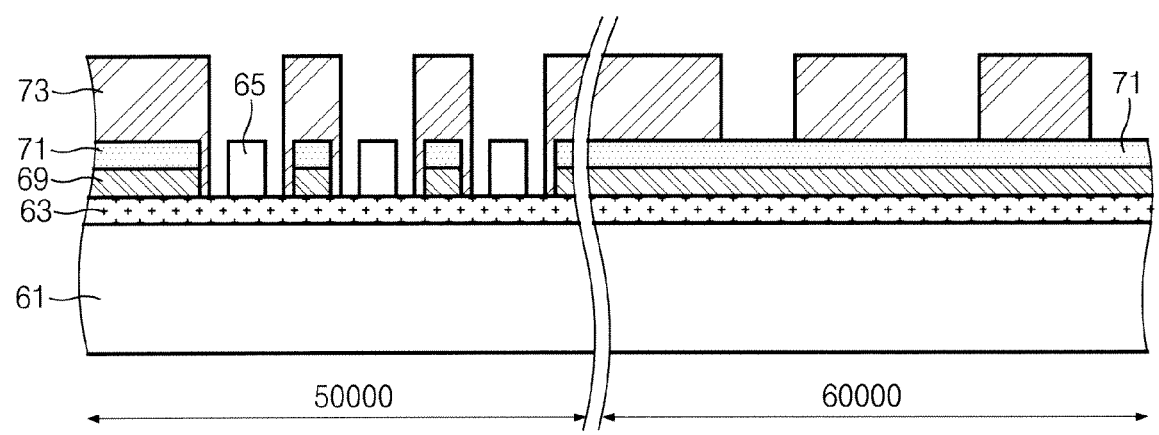

Referring to FIG. 8f, a photoresist pattern 73 is formed. Specifically, a photoresist film is coated over the resulting structure of FIG. 8e, exposed and developed using the second exposure mask 200 of FIG. 2b, thereby obtaining the photoresist pattern 73. In the second exposure mask 200, a shading pattern 220 for forming a contact hole in the cell region 50000 and forming an active region in the peripheral circuit region 60000 is formed over a quartz substrate 210.

The photoresist pattern 73 partially exposes the second hard mask pattern or the gap-fill insulating pattern in the cell region 50000, and is formed over the active region using an island type formed using the minimum interval in the peripheral circuit region 60000.

Figure 8G:
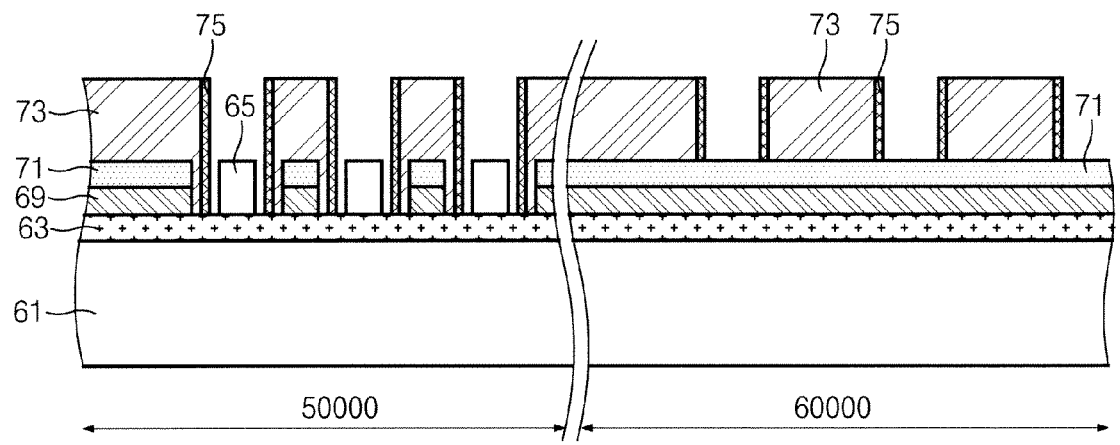
Figure 9A:
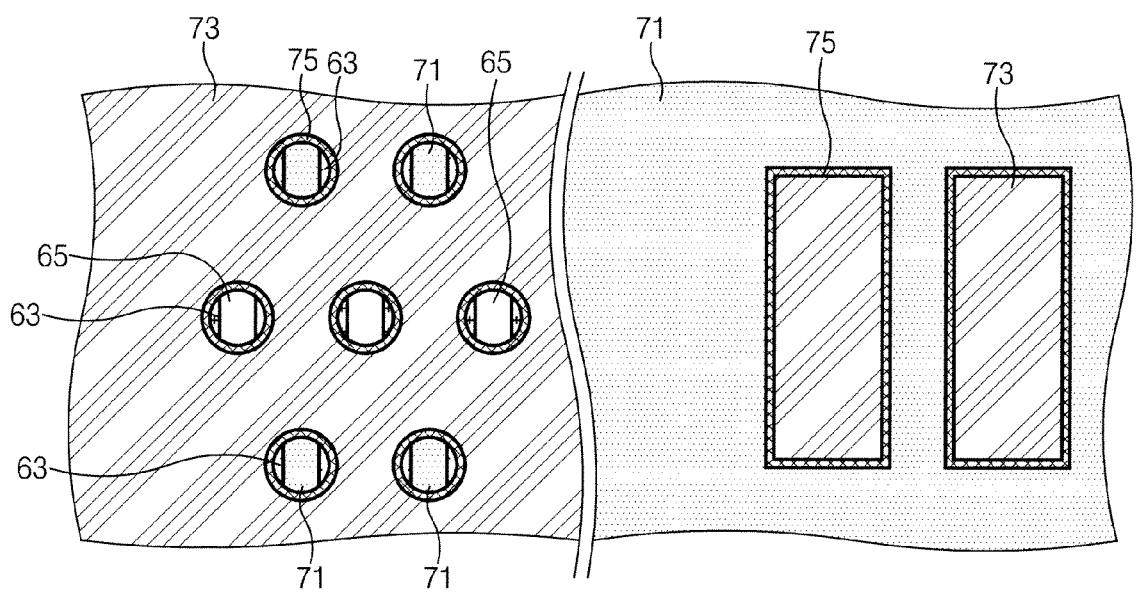

Referring to FIGS. 8g and 9a, the photoresist pattern 73 is reflowed to obtain a reflowed photoresist pattern 75. In the reflowed photoresist pattern 75, the contact hole is formed to have a decreased size in the cell region 50000, and the photoresist pattern 73 is formed to have an increased size in the peripheral circuit region 60000, so that an interval between the photoresist patterns 73 becomes smaller than the minimum interval (F).

The process of reflowing the photoresist pattern 75 may be replaced using a process of forming a RELACS material over the photoresist pattern 75 or of forming a spacer at sidewalls of the photoresist pattern 73. The reflowed photoresist pattern 75 is formed so that an interval between the patterns can be smaller than the minimum interval using photolithography equipment.

Figure 8H:
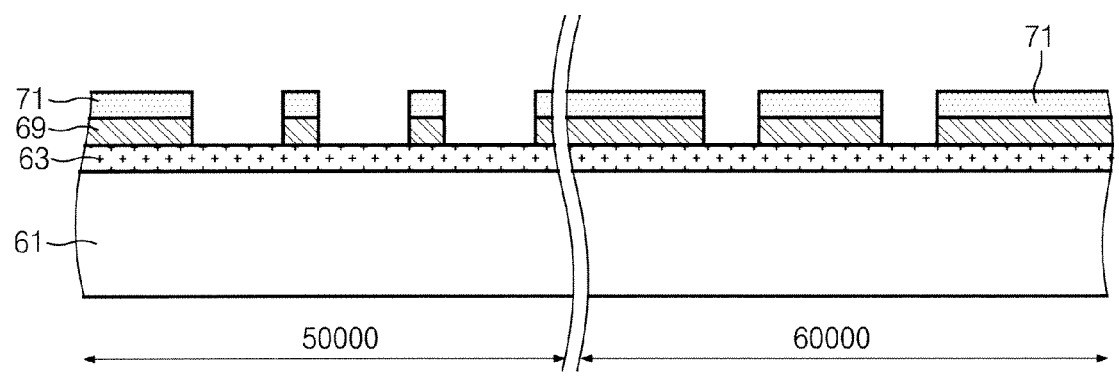
Figure 9B:
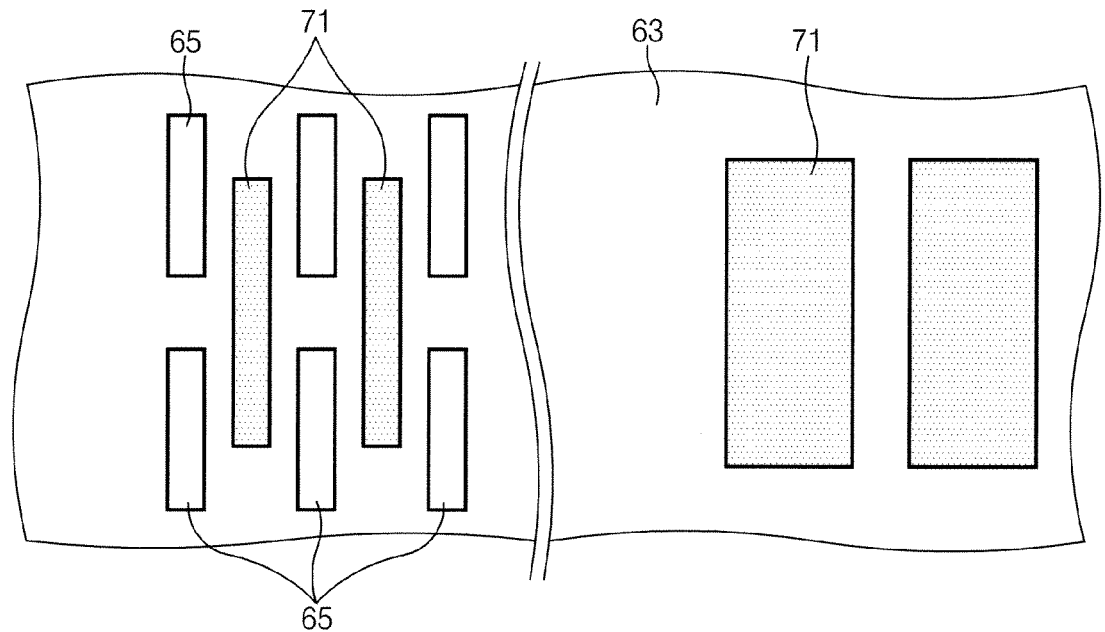

Referring to FIGS. 8h and 9b, the gap-fill insulating film 71 pattern, the second hard mask layer 65 pattern and the spacer insulating film 69 are etched using the photoresist pattern 73 and the reflowed photoresist pattern 75 as a mask, thereby obtaining a stacked structure including the spacer insulating film 69 and the gap-fill insulating film 71, and the second hard mask layer 65 pattern over the active regions of the cell region 50000 and the peripheral circuit region 60000.

When the photoresist pattern 73 or the reflowed photoresist pattern 75 remains, an additional removal process is performed.

Figure 8I:
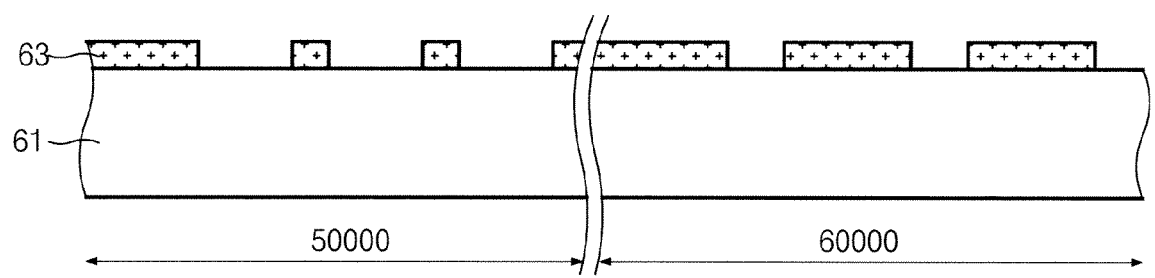
Figure 9C:
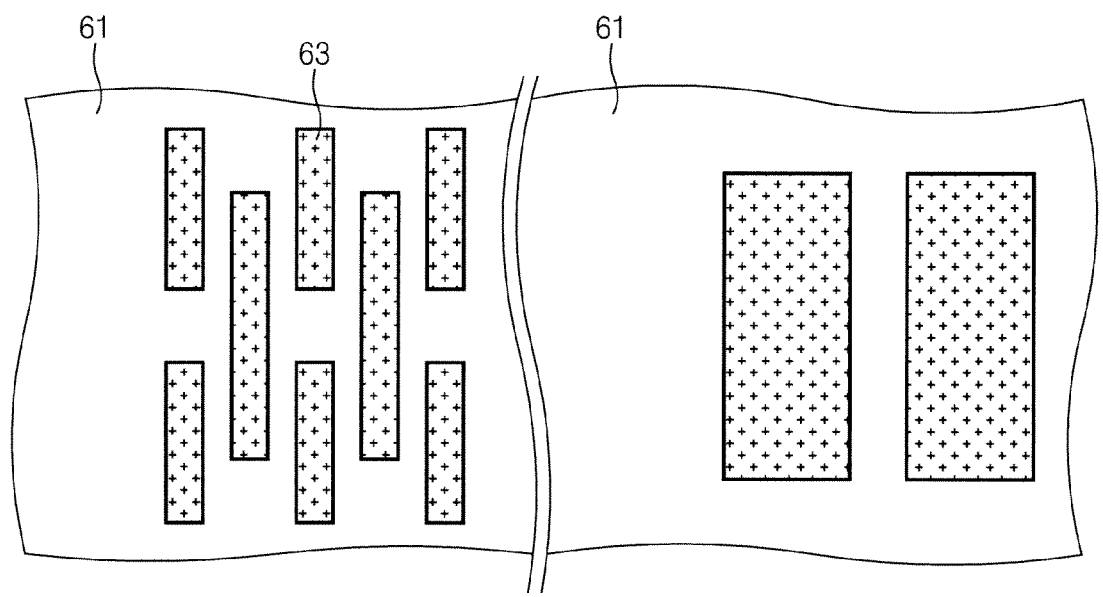

Referring to FIGS. 8i and 9c, the first hard mask layer 63 is etched using the stacked structure including the spacer insulating film 69 and the gap-fill insulating film 71, and the second hard mask layer 65 pattern as a mask, thereby obtaining a first hard mask layer 63 pattern. The stacked structure including the spacer insulating film 69 and the gap-fill insulating film 71, and the second hard mask pattern are removed.

The underlying layer (not shown) is etched using the first hard mask pattern as a mask, thereby obtaining a fine underlying pattern.

As described above, the disclosed method for forming fine patterns of a semiconductor device employs a double patterning process for forming small pitch patterns simultaneously in the cell region, the peripheral circuit region and the core region, thereby preventing mis-aligned exposures.

The above embodiments of the disclosure are illustrative and not limitative. Various alternatives and equivalents are possible. The invention is not limited by the type of deposition, etching polishing, and patterning steps described herein, nor is the invention limited to any specific type of semiconductor device. For example, the disclosure may be implemented in a dynamic random access memory (DRAM) device or nonvolatile memory device. Other additions, subtractions, or modifications are obvious in view of the present disclosure and are intended to fall within the scope of the appended claims.

What is claimed is:

1. A method for forming fine patterns of a semiconductor device, the method comprising:
   forming a first pattern having a line type over an underlying layer in a cell region;
   forming first spacers on the sidewalls of the first pattern in the cell region and forming a spacer insulating film over the underlying layer in the peripheral circuit region;
   forming a gap-fill insulating film between the first spacers in the cell region and over the spacer insulating film in the peripheral circuit region;
   removing the first spacers to form a second pattern between the first pattern;
   forming a first photoresist pattern that defines a contact hole in the cell region and defines an active region in a peripheral circuit region;
   etching the first pattern and the second pattern of the cell region, and the spacer insulating film and the gap-fill insulating film of the peripheral circuit region using the first photoresist pattern as a mask to divide each of the first pattern and the second pattern in the cell region and form island pattern in the peripheral circuit region; and
   etching the underlying layer using the divided first pattern, the divided second pattern and the island pattern.

2. The method according to claim 1, comprising forming the first pattern by:

forming a hard mask layer over the underlying layer;

forming a second photoresist pattern over the hard mask layer using a first exposure mask having a line-type shading region; and etching the hard mask layer using the second photoresist pattern as a mask to pattern the hard mask layer.

3. The method according to claim 2, wherein the spacer insulating film comprises a material having a higher etching selectivity than those of the hard mask layer and the gap-fill insulating film.

4. The method according to claim 2, wherein the gap-fill insulating film comprises a material having a lower etching selectivity than that of the hard mask layer.

5. The method according to claim 1, comprising forming the first photoresist pattern by:

forming a photoresist film over the first pattern and the second pattern and the underlying layer; and patterning the photoresist pattern using a second exposure mask having a transmitting region that defines the contact hole in the cell region and having a shading region that defines the island pattern in the peripheral circuit region.

6. The method according to claim 1, further comprising;

reducing a critical dimension (CD) of the contact hole before etching the first pattern and the second pattern.

7. The method according to claim 6, comprising reducing the critical dimension (CD) of the contact hole by a method selected from the group consisting of reflowing the first photoresist pattern, forming a resolution enhancement lithography assisted by chemical shrink (RELACS) material in the first photoresist pattern, and forming a second spacer on the sidewall of the first photoresist pattern.

8. The method according to claim 1, comprising forming the first spacers on the sidewalls of the first pattern by forming the spacer insulating film on the sidewalls of the first pattern.

9. The method according to claim 8, comprising forming the gap-fill insulating film between the first spacers by:

forming a gap-fill insulating material to fill a space between the first spacers; and planarizing the gap-fill insulating material until the spacer insulating film is exposed.

10. The method according to claim 9, comprising planarizing the gap-fill insulating material by an etch-back or a chemical mechanical polishing process.

11. The method according to claim 1, comprising removing the first spacers by using the gap-fill insulating film as an etching mask and using the first pattern and the underlying layer as an etching barrier.

\* \* \* \* \*